United States Patent [19]
Takahashi et al.

[11] Patent Number: 5,364,219
[45] Date of Patent: Nov. 15, 1994

[54] APPARATUS FOR CLEAN TRANSFER OF OBJECTS

[75] Inventors: Tetsuo Takahashi; Eisaku Miyauchi, both of Akita; Toshihiko Miyajima, Saku; Hideaki Watanabe, Akita, all of Japan

[73] Assignee: TDK Corporation, Japan

[21] Appl. No.: 902,720

[22] Filed: Jun. 23, 1992

[30] Foreign Application Priority Data

Jun. 24, 1991 [JP] Japan .................... 3-177803

[51] Int. Cl.$^5$ ............................................. B65G 65/00
[52] U.S. Cl. .................... 414/217; 414/939; 118/719; 204/298.25
[58] Field of Search ............ 414/217, 222, 331, 341, 414/343, 345, 467, 539, 935, 937, 939; 901/1; 204/298.25; 118/719

[56] References Cited

U.S. PATENT DOCUMENTS

| | | | |
|---|---|---|---|
| 4,534,389 | 8/1985 | Tullis | 414/217 X |
| 4,674,939 | 6/1987 | Maney et al. | 414/292 |
| 4,724,874 | 2/1988 | Parikh et al. | 141/98 |
| 4,732,527 | 3/1988 | Conche | 414/786 |
| 4,851,018 | 7/1989 | Lazzari et al. | 414/217 X |
| 4,897,963 | 2/1990 | Reboul et al. | 49/507 |
| 4,948,979 | 8/1990 | Munakata et al. | 250/492.2 |
| 4,990,047 | 2/1991 | Wagner et al. | 414/331 X |
| 5,058,526 | 10/1991 | Matsushita et al. | 414/937 X |
| 5,139,459 | 8/1992 | Takahashi et al. | 414/217 X |

FOREIGN PATENT DOCUMENTS

| | | |
|---|---|---|
| 3711212 | 12/1987 | Germany . |
| 3712064 | 10/1988 | Germany . |
| 3726025 | 2/1989 | Germany . |
| 63-28047 | 2/1988 | Japan . |

*Primary Examiner*—Michael S. Huppert
*Assistant Examiner*—Stephen Gordon
*Attorney, Agent, or Firm*—Lerner, David, Littenberg, Krumholz & Mentlik

[57] ABSTRACT

A clean transfer system having a first vacuum chamber with a first transfer port, a first shutter for opening and closing the first transfer port and a first connecting member surrounding the first transfer port. The first connecting member is provided with at least an exterior portion. A second vaccum chamber includes a second transfer port, a second shutter for opening and closing the second transfer port, and a second connecting member surrounding the second transfer port. The second connecting member has at least an exterior portion. A closed space is formed between the first and second connecting members, so that the first and second shutters are movable within the closed space.

11 Claims, 6 Drawing Sheets

APPARATUS FOR CLEAN TRANSFER OF OBJECTS

BACKGROUND OF THE INVENTION

This invention relates to a clean transfer method and an apparatus therefor, and more particularly to a clean transfer method for transferring an object to be transferred (hereinafter referred to as "transferred object") required for fabricating and/or assembling a product associated with a semiconductor or the like while keeping an operating environment clean and free of contamination, and an apparatus therefor.

Figure 1:
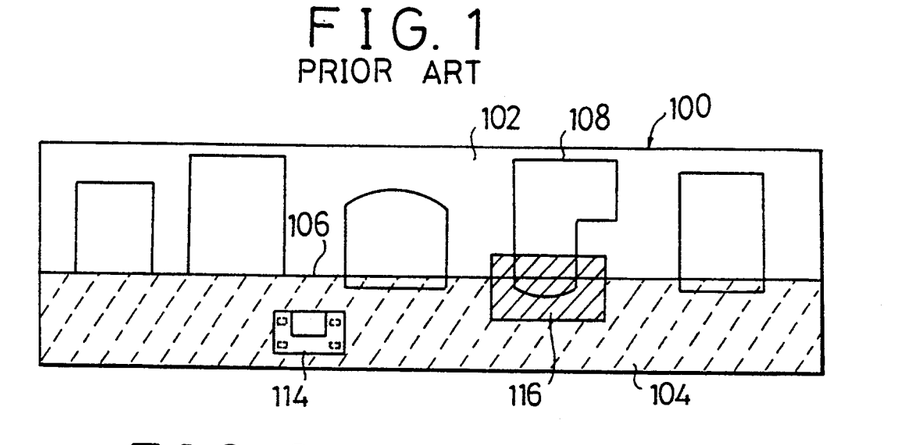
FIG. 1 is a schematic plan view showing an example of a conventional clean transfer system.
Figure 2:
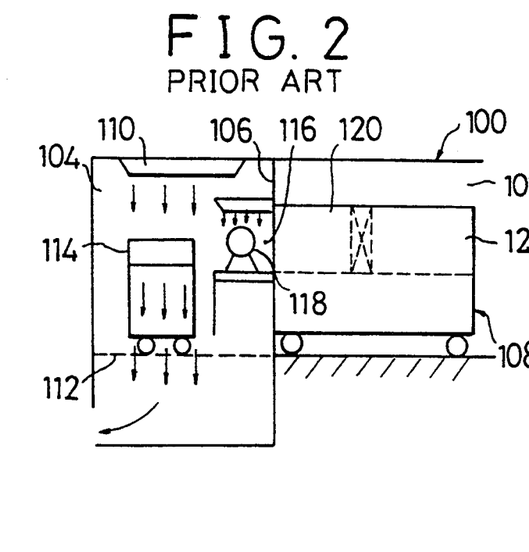
FIG. 2 is a side elevation view of the conventional clean transfer system shown in FIG. 1.

In general, a clean transfer system which has been conventionally practiced is constructed in such a manner as shown in FIGS. 1 and 2. More particularly, the system includes a room 100, which is divided into a maintenance chamber 102 and a clean chamber 104 through a partition 106. The maintenance chamber 102 is permitted to communicate with an ambient atmosphere and is provided therein with various processing sections (processing equipments) 108 used for precision film formation required in manufacturing of a semiconductor.

The clean chamber 104 is kept at considerable cleanness as high as Classes 100–10. The term "Class 100" refers to cleanness wherein the number of dust particles having a size of 0.5, $\mu$m or higher per 1 ft$^3$ is 100 or less and the term "Class 10" indicates. cleanness with the number of dust particles having the size of 0.5, $\mu$m or higher per 1 ft$^3$ is 10 or less. An airstream is downwardly introduced from a ceiling of the clean chamber 104 through filter 110 sufficient to ensure the cleanness between the Class 100 and Class 10 into the clean chamber 104, and then discharged from a perforated floor 112. A clean shuttle 114 is movably arranged in the clean chamber 104 and is kept at the cleanness between the Class 10 and Class 1. The term "Class 1" indicates the cleanness wherein the number of dust particles having a size 0.5, $\mu$m or more per 1 ft$^3$ is 1 or less. A transfer port of each of the processing sections 108 is permitted to communicate with the clean chamber 104 through an opening formed through the partition 106 and a peripheral area 116 around the opening is locally kept at cleanness between the Classes 10 and 1.

Delivery of a transferred object 118 such as a semiconductor wafer or the like between the clean shuttle 114 and the processing section 108, as shown in FIG. 2, is carried out by transferring the transferred object 118 from the clean shuttle 114 through the peripheral area 116 to a load lock chamber (preliminary vacuum chamber) 120, closing a shutter for the transfer port, evacuating the preliminary vacuum chamber 120 to a vacuum and then transferring the transferred object to a processing chamber (vacuum chamber) 122 of the processing section 108.

Figure 3:
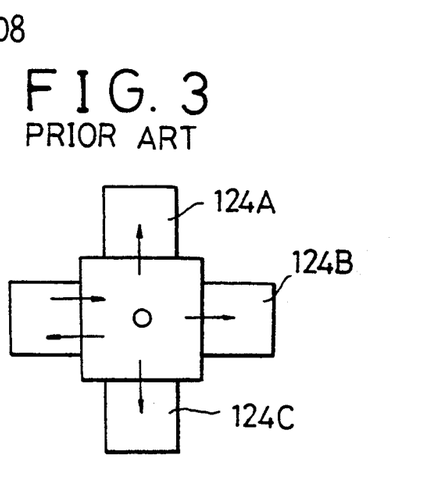
FIG. 3 is a schematic plan view showing a conventional multi-chamber system.

As another conventional clean transfer system, a multi-chamber system which is constructed as shown in FIG. 3 has been used. In the multi-chamber system, a single load lock chamber is commonly used for processing sections 124A, 124B and 124C for sputtering, CVD, etching and the like.

In the conventional clean transfer system shown in FIGS. 1 and 2, it is required that the clean chamber 104 is provided therein with a relatively increased internal space and kept at considerable cleanness as high as between the Class 100 to 10. Unfortunately, it is highly costly to keep the large clean chamber at such high cleanness as described above. Also, in the prior art, it is required to provide each of the processing sections 108 including the processing chamber 122 with the load lock chamber 120, thus, vacuum evacuation of the load lock chamber is indispensable, resulting in the processing section being complicated in structure. Further, the prior art fails to substantially isolate an interior of the clean shuttle 114 and the peripheral area 116 from suspended dust irrespective of an increase in cleanness. Furthermore, vacuum evacuation of the load lock chamber 120 and introduction of air thereinto which are carried out during delivery of the transferred object between the clean shuttle 114 and the processing section 108 cause a rapid variation in pressure, resulting in dust or any foreign matter such as moisture, impurity gas or the like being scattered in the processing section 108 to lead to pollution of the transferred object.

The multi-chamber system shown in FIG. 3 fails to increase the number of the processing sections arranged and provide arrangement of the system with an increased degree of freedom, and is troublesome in maintenance.

SUMMARY OF THE INVENTION

The present invention has been made in view of the foregoing disadvantages of the prior art.

Accordingly, it is an object of the present invention to provide a clean transfer method which is capable of transferring a transferred object to a processing section while keeping an operating environment stably clean.

It is another object of the present invention to provide a clean transfer method which is applicable to precision film formation in manufacturing of a precision element such as a semiconductor wafer.

It is a further object of the present invention to provide a clean transfer apparatus which is capable of transferring a transferred object to a processing section while keeping an operating environment stably clean.

It is still another object of the present invention to provide a clean transfer apparatus which is applicable to precision film formation in manufacturing of a precision element.

In accordance with one aspect of the present invention, a clean transfer method is provided. The method comprises the steps of hermetically connecting a movable clean box including a vacuum clean chamber provided with a transfer port which is opened or closed by a shutter and a processing section including a processing chamber provided with a transfer port which is opened or closed by a shutter while keeping the shutters closed, to thereby permit a closed space facing the transfer ports to be defined therebetween; evacuating the closed space to a vacuum; opening the shutters to permit the transfer ports to communicate with each other through the closed space; and transferring a transferred object while keeping the communication between the transfer ports.

In accordance with another aspect of the present invention, a clean transfer apparatus is provided. The apparatus includes at least one movable clean box including a vacuum clean chamber provided with a transfer board which is opened or closed through a shutter and at least one processing section including a processing chamber provided with a transfer port which is opened or closed through a shutter. The clean box and processing section cooperate with each other to form a closed space facing the transfer ports therebetween when connected to each other. The apparatus further includes a vacuum evacuation means for evacuating the closed space to a vacuum. The vacuum evacuation means is provided at any one of the processing section and clean box.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENT

Now, the present invention will be described hereinafter with reference to FIGS. 4 to 8, wherein like reference numerals designate like or corresponding parts throughout.

Figure 4:
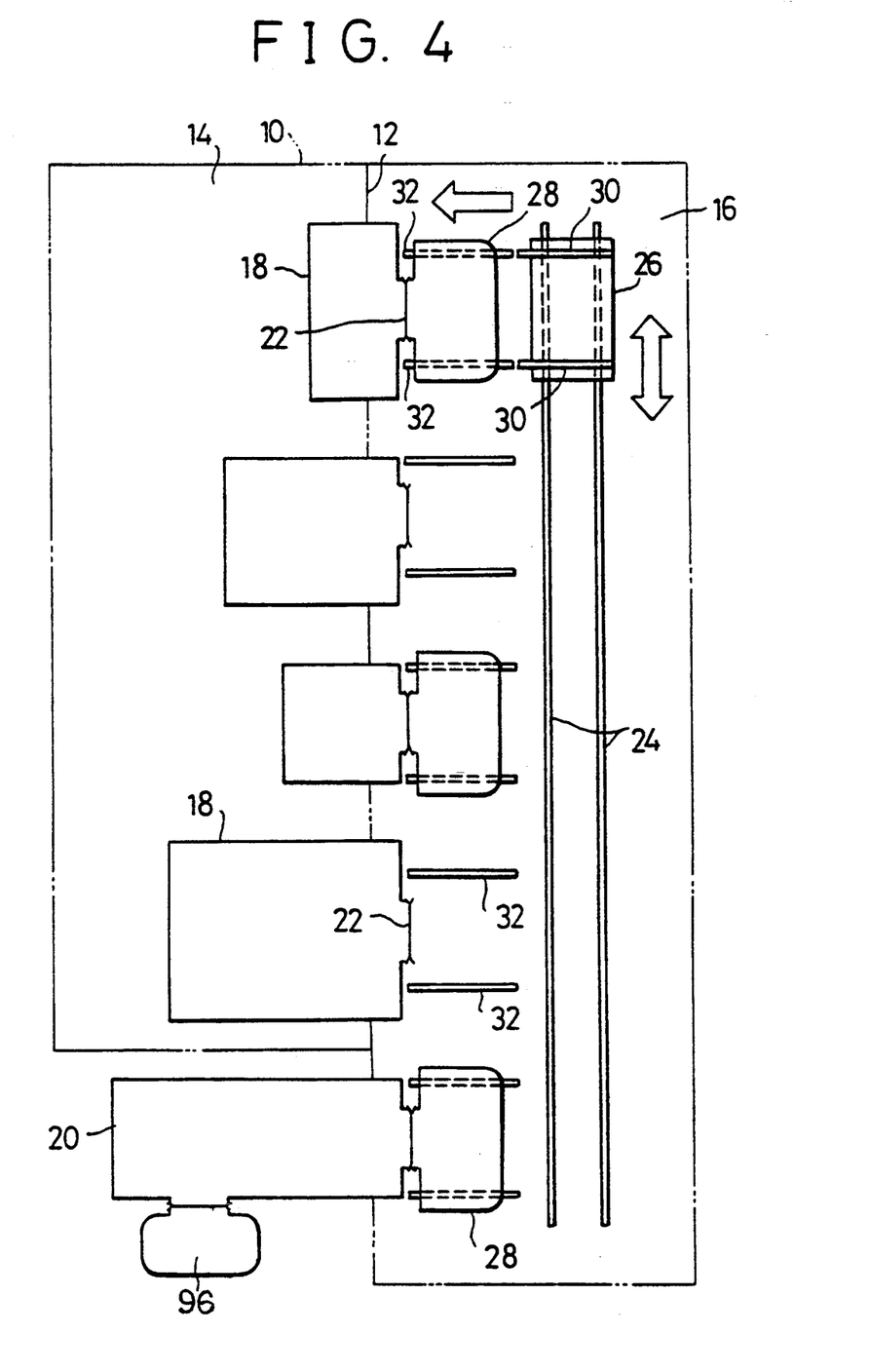
FIG. 4 is a plan view generally showing an embodiment of a clean transfer apparatus according to the present invention.

FIG. 4 generally shows an embodiment of a clean transfer apparatus according to the present invention. A clean transfer apparatus of the illustrated embodiment includes a room 10, in which a partition 12 is arranged to divide the room 10 into a maintenance chamber 14 open to an ambient atmosphere and a simple clean chamber 16 kept at cleanness somewhat higher than the maintenance chamber 14. In the maintenance chamber 14 are arranged various processing sections or processing equipment 18, and outside the maintenance chamber 14 is arranged a clean stocker 20. The processing sections 18 each include a processing chamber used for film formation. The simple clean chamber 16 is kept at cleanness as low as about Class 10,000; therefore, it does not require a grating-like floor such as the floor (FIG. 2) described above with reference to the prior art, and the like. Thus, the clean chamber 16 merely requires a simple dust-proof means. The processing sections 18 each are so arranged that a part thereof projects through the partition 12 into the clean chamber 16 and provided with a transfer port 22 on a side thereof facing the clean chamber 16.

In the simple clean chamber 16 are fixedly arranged transfer rails 24 so as to be parallel to a direction of arrangement of the processing sections 18, on which a carriage 26 is mounted so as to travel along the rails 24. The carriage 26 is adapted to carry a clean box 28 thereon. Thus, the clean box 28 may be moved to a required position in the clean chamber 16. Also, the carriage 26 has mount rails 30 fixed thereon so as to extend in a direction perpendicular to the rails 24, and the clean box 28 is carried on the rails 30. Between each of the processing sections 18 and the transfer rails 24 are arranged a pair of guide rails 32 in a manner to be parallel to the mount rails 30 and flush with the mount rails 30. The guide rails 32 are arranged at an interval equal to that between the mount rails 30 so that the clean box 28 may be moved onto the rails 32, to thereby be rendered opposite to the transfer port 22 of each of the processing sections 18. Thus, alignment or registration between the mount rails 30 and the guide rails 32 to substantially connect both to each other permits a guide way to be formed with respect to the transfer port 22 of the processing section 18, so that traveling of the clean box 28 along the guide way permits it to be moved between the carriage 26 and each of the processing sections 18. For this purpose, the clean box 28 is provided with wheels which permit the clean box 28 to travel on the mount rails 30 and guide rails 32. Further, the clean box 28 is provided with a lock means for locking or fixing the clean box 28 on the mount rails 30 of the carriage 26 during traveling of the carriage 26 on the transfer rails 24. Thus, it will be noted that the simple clean chamber 16 acts as a transfer chamber for transferring the clean box 28 having a transferred object received therein.

Now, the clean transfer apparatus of the illustrated embodiment will be described more detailedly with reference to FIGS. 5 to 8.

The processing sections 18 each include a processing chamber or vacuum chamber 34 received therein, in which a holder 36 and the like required for practicing precision film-formation and the like are arranged, so that a substrate 38 which is the transferred object is subject to predetermined processing while being held on the holder 36. The above-described transfer port 22 is provided at a portion of each processing sections 18 abutted against the clean box 28 and is opened or closed by a shutter 40. The abutted portion of each of the processing sections 18 is provided with an operation recess 42 sufficient to ensure adequate movement of the shutter 40. Further, the abutted portion is provided with a flange 44 in a manner to surround the shutter operation recess 42.

The clean box 28 has a vacuum clean chamber 46 and a stock chamber 48 defined therein and is provided on a bottom thereof with wheels 50 which are adapted to be carried on the mount rails 30 and guide rails 32 described above. The vacuum chamber 46 and stock chamber 48 are formed by dividing a space in the clean box 28 through a partition 52 formed with a through-hole or aperture 54, so that pressures in both chambers are rendered equal to each other. In the vacuum clean chamber 46 is arranged a robot arm 56 for moving or transferring the substrate 38 while holding it. In the stock chamber 48 are vertically arranged a series of substrate supporting shelves 58, which are adapted to support a plurality of the substrates or transferred objects 38 at predetermined intervals thereon. The robot arm 56 functions to move the substrate 38 between the stock chamber 48 and the processing chamber 34 of each of the processing sections 18 while holding it and, for this purpose, it is constructed so as to be vertically movable and stretchable. The robot arm 56 is rotated and vertically moved by a robot arm drive mechanism 60 for rotating and vertically moving it, which is stationarily arranged outside the vacuum clean chamber 46 in the clean box 28. The robot arm 56 includes a first arm 62 fixed on a rotating and lifting shaft 64 of the drive mechanism 60, a second arm 66 stretchably mounted on a distal end of the first arm 62, a first finger 68 stretchably mounted on a distal end of the second arm 66 and a second finger 70 stretchably mounted on a distal end of the first finger 68. The first arm 62, second arm 66, first finger 68 and second finger 70 are rendered stretchable and each have a fulcrum for its stretching movement indicated at dashed lines in FIGS. 5 to 8. Also, the robot arm 56 is vertically moved with vertical movement of the rotating and lifting shaft 64, so that the uppermost second finger 70 may be moved to a desired position.

Figure 5:
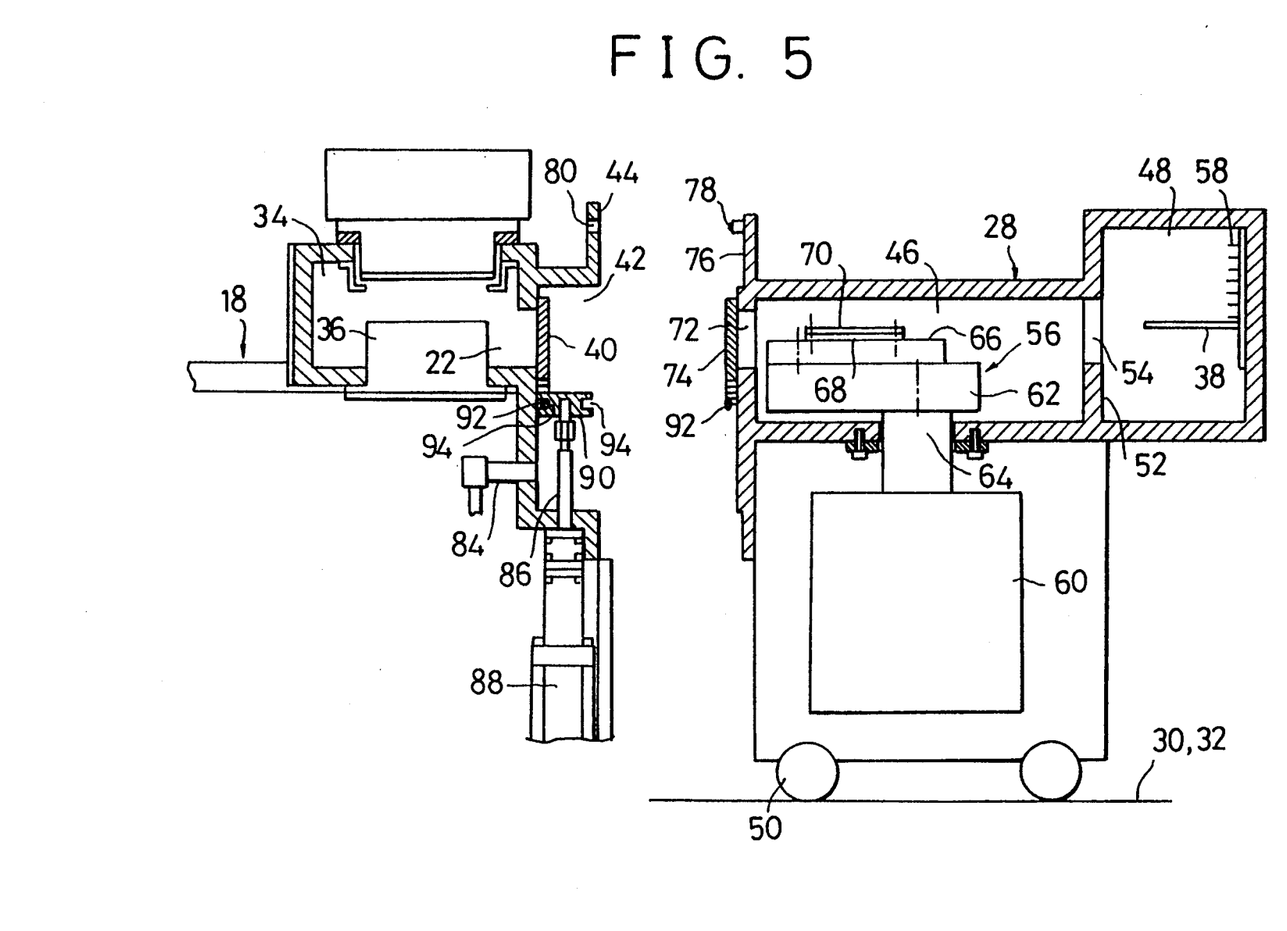
FIG. 5 is a sectional side elevation view showing a structure of a clean box and one of the processing sections in the embodiment shown in FIG. 4, wherein the clean box and processing section are separated from each other.

A portion of the clean box 28 abutted against each of the processing sections 18 is provided with a transfer port 72 opposite to the transfer port 22 of the each of the processing sections 18. The transfer port 72 is provided with a shutter 74 for opening or closing the port 72. Between the shutter 40 and the transfer port 22 of each processing section 18 is arranged a sealing means such as an 0-ring or the like for attaining air-tight sealing therebetween. Likewise, a sealing means is arranged between the shutter 74 and the transfer port 72 of the clean box 28.- Also, around each of the shutters 40 and 74 is provided a guide for vertically slidably supporting the shutter while preventing falling of the shutter. However, when each of the processing sections 18 and the clean box 28 are separated from each other as shown in FIG. 5, a difference in pressure between a high vacuum in the processing chamber 34 and an atmospheric pressure and that between a high vacuum in the vacuum clean chamber 46 and the atmospheric pressure cause the shutters 40 and 74 to be pressed to hermetically seal the transfer ports 22 and 72, to thereby prevent both shutters from sliding. The above-described abutted portion of clean box 28 is provided with a flange 76 so as to surround the transfer port 72, and the flange 76 is formed with a positioning projection 78, which is arranged so as to be fitted in a positioning hole 80 formed at each of the processing sections 18 in a manner to positionally correspond to the projection 78. When both flanges 44 and 76 are abutted against each other, the shutter operation recess 42 of the processing section is hermetically sealed by the abutted portion of the clean box 28 to define a closed space 82 between both transfer ports 22 and 72, which is then evacuated to a vacuum through a vacuum evacuation passage 84 by means of a vacuum evacuation system such as a vacuum pump or the like provided with respect to each of the processing sections 18.

The processing sections 18 each are provided with a shutter actuation mechanism operatively connected to the shutter 40 so as to actuate it. The shutter actuation mechanism includes a rod 86 vertically moved by an air cylinder 88 and an engagement member 90 fixedly mounted on a distal end of the rod 86. The shutters 40 and 74 each are formed at a lower end thereof with an engagement projection 92, which is adapted to be fittedly engaged with an engagement recess 94 formed at each of both side ends of the engagement member 90. The shutter 40 of the processing section 18 is adapted to keep the engagement projection 92 of the shutter and the engagement recess 94 of the engagement member 90 constantly engaged with each other and integrally connected to each other. The shutter 74 of the clean box 28 is connected to the engagement member 90 when the clean box 28 is connected to the processing section 18. The shutters 40 and 74 thus connected to each other through the engagement member 90 constitute a double gate valve structure for concurrently operating the transfer ports 22 and 72 with vertical movement of the rod 86.

The processing chamber 34 of each of the processing sections 18 and the vacuum clean chamber 46 of the clean box 28, as well as the stock chamber 48 are kept clean and at a degree of vacuum as high as 1 Torr or less. The processing sections 18 each are equipped with a vacuum evacuation system such as a vacuum pump or the like for evacuating the processing chamber 34 to a vacuum, and the vacuum clean chamber 46 and stock chamber 48 of the clean box 28 are evacuated to a vacuum through a vacuum evacuation means arranged on the clean stocker 20 when or before the transfer operation is started.

Now, the manner of transfer of the transferred object or substrate 38 such as a semiconductor wafer or the like will be described hereinafter.

Figure 6:
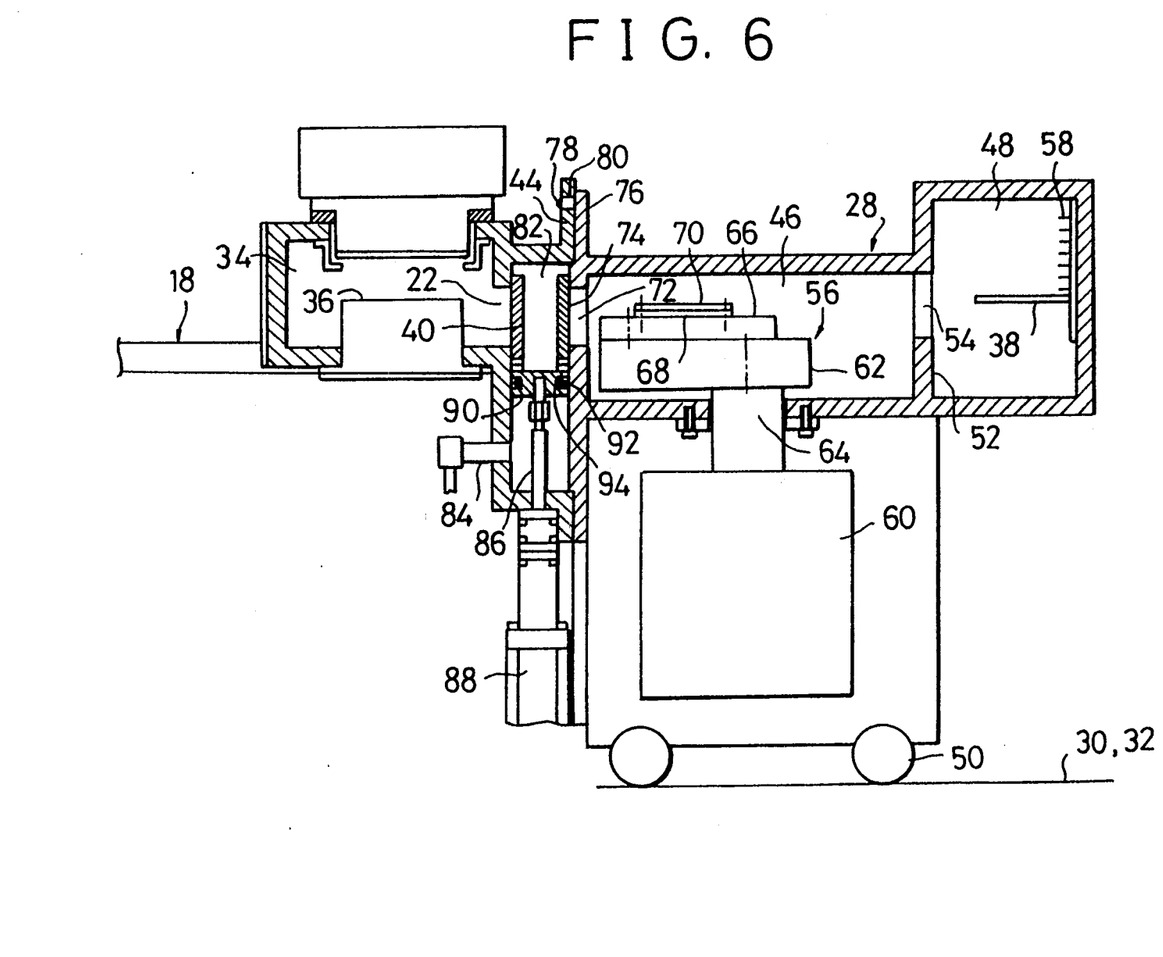
FIG. 6 is a sectional side elevation view of the clean box and the processing section of FIG. 5 which are connected to each other.

First, the vacuum clean chamber 46 and stock chamber 48 of the clean box 28 are previously evacuated to a vacuum, to thereby be kept substantially free of suspended dust and/or any foreign matter. Also, the substrate 38 is kept held on the shelf 58 of the stock chamber 48 in the clean box 28 by means of the robot arm 56 as shown in FIG. 5. For this purpose, it may be previously carried out to transfer the substrate from the clean stocker 20 to the clean box 28. The clean box 28 is carried on the carriage 26 and moved to a selected one of the processing sections 18 along the transfer rails 24. Then, the clean box 28 travels on the mount rails 30 and then the guide rails 32. Then, the transfer ports 22 and 72 are rendered opposite to each other to cause the processing section 18 and clean box 28 to be in proximity to each other, as shown in FIG. 6. Subsequently, the positioning projection 78 and hole 80 are fittedly engaged with each other and both flanges 76 and 44 are pressed to each other to carry out hermetic sealing therebetween. This results in the closed space 82 being formed between both transfer ports 22 and 72, as well as the shutter 74 of the clean box 28 being connected to the engagement member 90 of the shutter actuation mechanism to form the double gate valve in the closed space 82.

Figure 7:
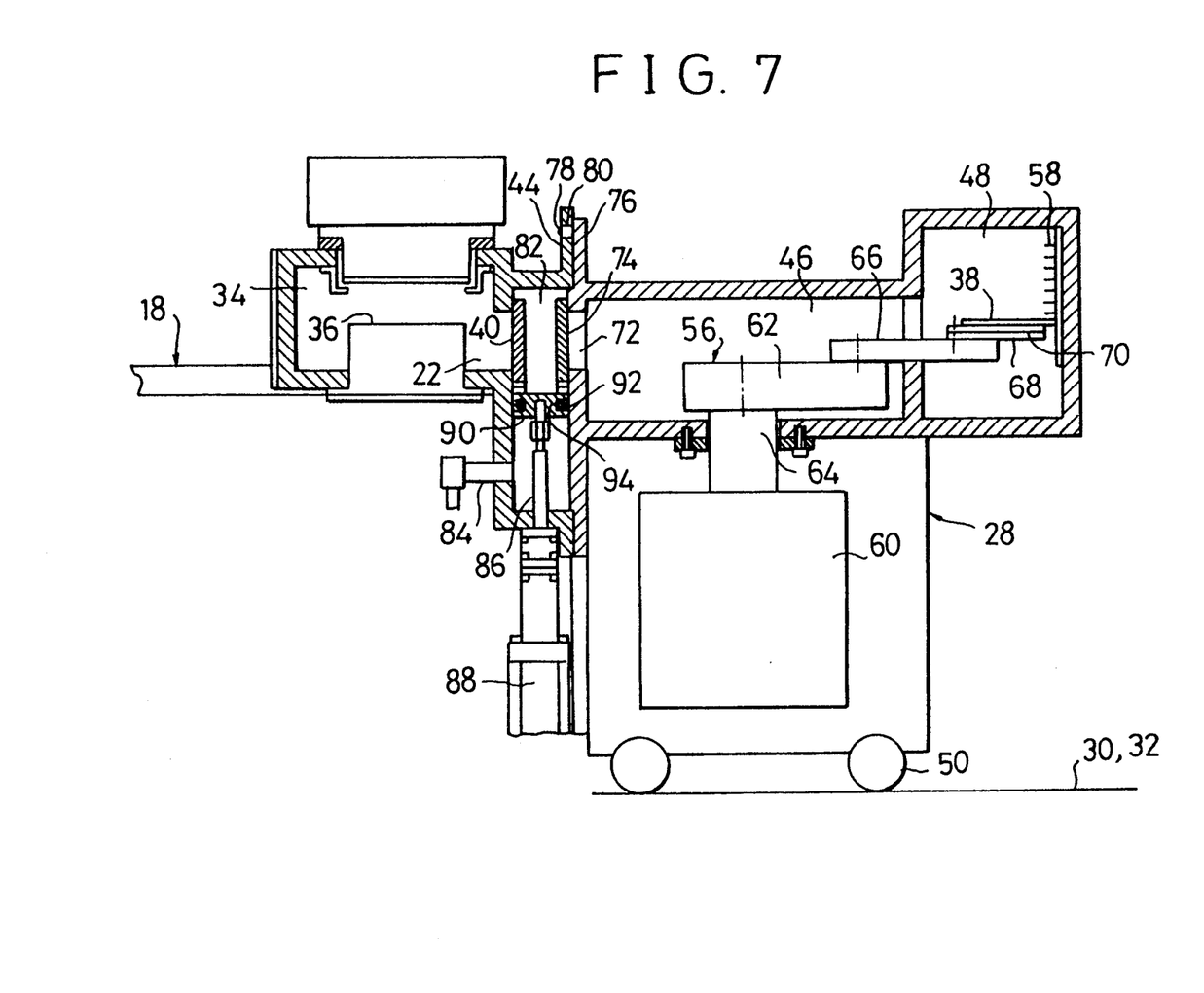
FIG. 7 is a sectional side elevation view of the clean box and processing section of FIG. 5 kept connected together in which the clean Box and processing section are ready to transfer a transferred object from the clean box to the processing section.
Figure 8:
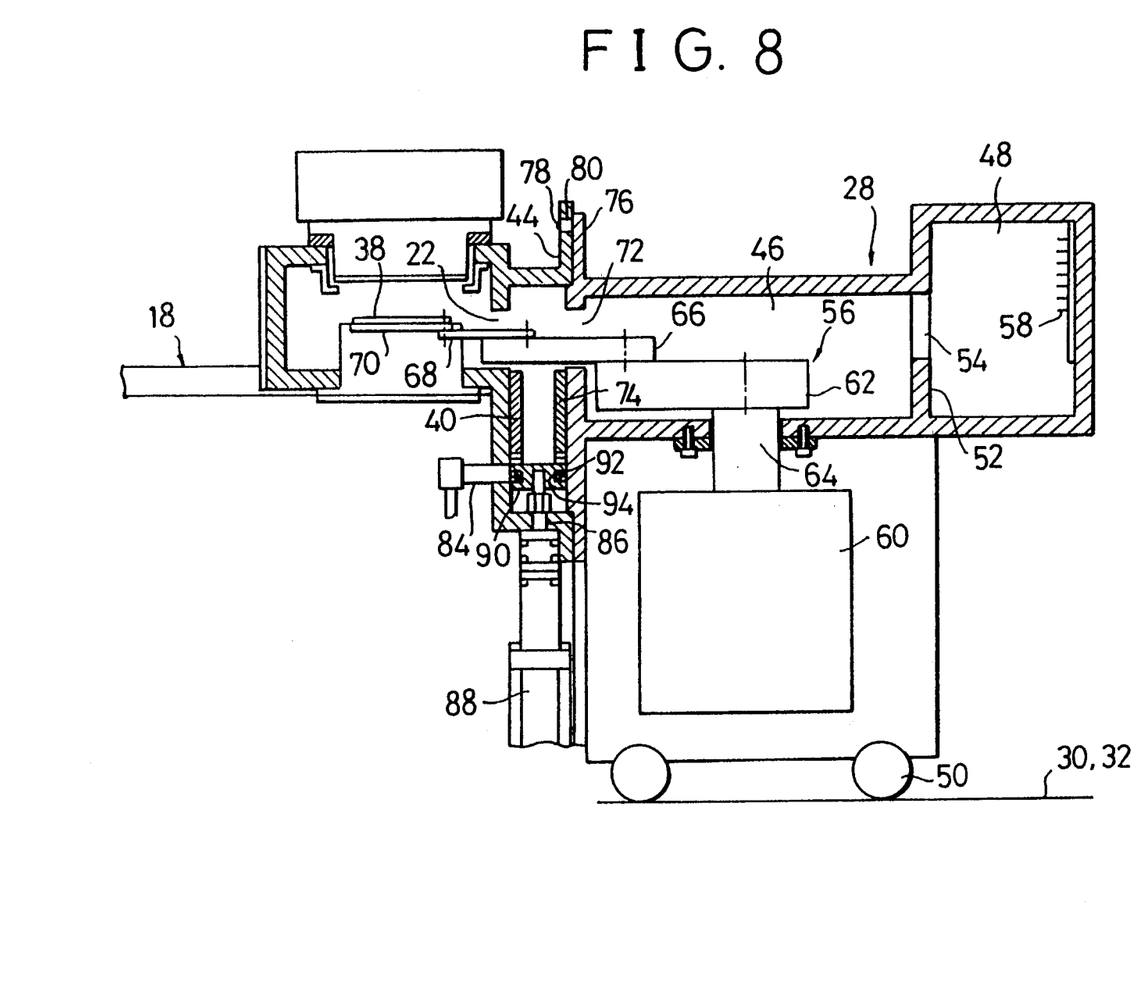
FIG. 8 is a sectional side elevation view of the clean box and processing section of FIG. 5 kept connected together wherein delivery of a transferred object from the clean box through a transfer port to the processing section is completed.

Subsequently, the vacuum evacuation system of the processing section 18 is actuated to evacuate the closed space 82 to a vacuum of the same level as the processing chamber 34 and vacuum clean chamber 46, to thereby be kept clean. Then, the rod 86 of the shutter actuation mechanism is lowered to open the shutters 40 and 74 closing the transfer ports 22 and 72, to thereby cause the closed space 82 to communicate with the transfer ports 22 and 72. Removal of the substrate 38 received in the stock chamber 48 of the clean box 28 therefrom is carried out during or after evacuation of the closed space 82 as shown in FIG. 7, and transfer of the substrate 38 onto the holder 36 of the processing chamber 34 is carried out after opening of the shutters 40 and 74 as shown in FIG. 8.

When the transfer of the substrate 38 into the processing chamber 34 is completed, the robot arm 56 is returned to the original position and the rod 86 of the shutter actuation mechanism is lifted to close the transfer ports 22 and 72 as shown in FIG. 6. Then, an ambient atmosphere is introduced into the closed space 82 to make pressure therein equal to atmospheric pressure. At this time, the transfer ports 22 and 72 are hermetically sealed by the shutters 40 and 74. Then, the processing section 18 and clean box 28 are separated from each other. The clean box 28 is moved from the guide rails 32 to the mount rails 30, to thereby be returned onto the carriage 26 and then moved toward the next processing section 18.

The illustrated embodiment is constructed so as to transfer the transferred object from each of the processing sections to the clean box. However, transfer of the transferred object from the processing chamber to the clean box is likewise carried out by hermetically connecting the processing section and clean box to each other, evacuating the closed space 82 and opening the shutters 40 and 74, as in the illustrated embodiment.

The clean stocker 20 is so constructed that an interior thereof is kept at high cleanness and varied in pressure within a range of from an ambient atmosphere to a vacuum. The clean stocker 20 is provided with a transfer port like the transfer port 22 of the processing section 18. The guide rails 32 are also arranged in front of the clean stocker 20. The clean stocker 20 functions to not only feed the transferred object unprocessed to the clean box 28 but receive, from the clean box 28, the object in the middle of processing which has been subject to processing in one or some of the processing sections or the object on which processing has been completed and temporarily store them therein. To the clean stocker 20 may be connected a wet box 96, through which the transferred object may be subject to a wet treatment.

The illustrated embodiment permits the shutters 40 and 74 to be concurrently open while keeping the closed space 82 evacuated to a vacuum, to thereby effectively prevent leakage of air due to actuation of the shutters. Also, the closed space 82 is evacuated to a vacuum of the same level as the processing chamber 34 of the processing section 18 and the vacuum clean chamber 46 of the clean box 28; therefore, communication between the processing chamber 34 and the vacuum clean chamber 46 and stock chamber 48 as shown in FIG. 8 does not deteriorate a high vacuum formed therein, so that the clean box 28 which does not include any independent vacuum evacuation system therefor may be used for transfer of the next substrate without any specific operation therefor. Further, the illustrated embodiment is so constructed that the means for actuating the shutter 74 for operating the transfer port 72 of the clean box 28 is arranged on the side of the processing sections 18 and the vacuum evacuation means for the closed space 82 is likewise arranged on the side of the processing sections 18. Such construction permits the clean box 28 to be used only for transfer of the substrate, to thereby substantially reduce a weight of the clean box 46. Furthermore, the shutters 40 and 74 and actuation mechanism therefor are merely required to be arranged outside the vacuum clean chamber 46, to thereby effectively reduce a volume of the clean chamber 46, resulting in an increased a period of time during which it is kept at a vacuum. Moreover, the number of clean boxes and processing sections arranged may be suitably varied as required. Also, the clean box 28 may be moved through the carriage 26 to a plurality of the processing sections, so that the illustrated embodiment may be applicable to various treatments without changing arrangement of the processing sections 18, to thereby be accommodated to diversified small-quantity production.

In the embodiment described above, the clean box 28 is so constructed that the vacuum clean chamber 46 and stock chamber 48 therein are evacuated to a vacuum through the vacuum evacuation system arranged at a location separate from the clean box such as, for example, the clean stocker 20, when the operation of the apparatus is started. Alternatively, the clean box 28 per se may include an independent vacuum evacuation system therefor. Also, the vacuum evacuation system for the closed space 82 may be arranged on the side of the clean box 28. In addition, the shutter operation recess 42 and shutter actuation mechanism may be provided on the side of the clean box 28.

As can be seen from the foregoing, the present invention is so constructed that the closed space which is evacuated to a vacuum may be established between the transfer port of the clean box and the transfer port of the processing chamber of the processing section. Such construction permits a high vacuum to be formed in the clean chamber and processing chamber associated therewith without causing a pressure variation therein irrespective of opening or closing of the transfer ports, to thereby effectively prevent scattering of dust or any other foreign matter therein and intrusion of it thereinto. Thus, the present invention effectively transfers the transferred object such as a semiconductor wafer or the like while keeping the operation environment clean, resulting in eliminating arrangement of a load lock chamber and the like which have been required in the prior art, to thereby simplify the structure of the processing sections. This leads to application of the present invention to high-precision film formation and direction of it to any possible future manufacturing of super-precision elements. Also, this permits the present invention to contribute to an improvement in yields and a decrease in manufacturing costs. Further, the present invention permits the number of clean boxes and processing chambers and arrangement thereof to be suitably varied as desired, to thereby be satisfactorily accommodated to diversified small-quantity production. Further, the present invention eliminates a necessity of keeping cleanness in the simple clean chamber in which the clean box travels at a high level, therefore, the apparatus of the present invention can be simplified in structure.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A clean transfer system, comprising:
   a first vacuum chamber having a first transfer port, a first movable shutter for opening and closing said first transfer port, a first connecting member surrounding said first transfer port, said first connecting member having at least an exterior portion;

a second vacuum chamber having a second transfer port, a second movable shutter for opening and closing said second transfer port, a second connecting member surrounding said second transfer port, said second connecting member having at least an exterior portion;

means for moving said first and second shutters so as to open or close said first and second transfer ports; and said first and second connecting members having at least a connected position, in said connected position a closed space being formed between said first and second connecting members, so that said exterior portions of said first and second connecting members are separated by said closed space and said first and second shutters are movable within said closed space.

2. A clean transfer system of claim 1, wherein said first and second movable shutters are arranged outside said first and second vacuum chambers respectively, whereby said first and second movable shutters may each be urged to respective outer surfaces of said first and second transfer ports by a differential pressure between inside and outside of each of said first and second vacuum chambers while said first and second connecting members are not connected to each other.

3. A clean transfer system of claim 2, further comprising:

a first room open to an ambient atmosphere; and a second room isolated from said first room, said second room having a smaller number of airborne particles than said first room;

said first vacuum chamber being disposed in said first room;

said second vacuum chamber being disposed in said second room.

4. A clean transfer system [as defined of claim 2, further comprising means for evacuating said closed space when said first and second connecting members are connected to each other prior to opening said first and second movable shutters.

5. A clean transfer system of claim 3, further comprising means for evacuating said closed space when said first and second connecting members are connected to each other prior to opening said first and second movable shutters.

6. A clean transfer system of claim 4, wherein said first vacuum chamber comprises an apparatus for processing a transferred object.

7. A clean transfer system of claim 3, wherein said first room is a maintenance room, and said second room is a transfer room.

8. A clean transfer system of claim 3, wherein said second vacuum chamber is movable, said first vacuum chamber comprises a plurality of first vacuum chambers including a corresponding plurality of said first transfer ports and a corresponding plurality of said first connecting members, and said second connecting member is capable of being connected to each of said plurality of said first connecting members.

9. A clean transfer system of claim 1, wherein in said connected position a hermetic connection is formed between said first and second connecting members.

10. A clean transfer system of claim 9, wherein said first shutter movably engages said exterior portion of said first connecting member and said second shutter movably engages said exterior portion of said second connecting member.

11. A clean transfer system of claim 10 wherein each of said first and second shutters further comprises engaging and rear surfaces extending along a longitudinal axis of the other shutter, said engaging surface of said first shutter faces said first transfer port and said engaging surface of said second shutter faces said second transfer port, while said rear surfaces of said first and second shutters face each other.

* * * * *

UNITED STATES PATENT AND TRADEMARK OFFICE
CERTIFICATE OF CORRECTION

PATENT NO. : 5,364,219
DATED : November 15, 1994
INVENTOR(S) : Takahashi et al

It is certified that error appears in the above-indentified patent and that said Letters Patent is hereby corrected as shown below:

Column 1, line 27, "cleannes" should read —cleanness,—.

Column 1, line 29, delete "." after indicates.
Column 1, line 67, delete "to" and insert —and class—.
Column 3, line 34, "Box" should read —box—.
Column 5, line 34, "28.-" should read —28.—.
Column 9, line 67, delete "[as defined".

Signed and Sealed this

Second Day of May, 1995

Attest:

BRUCE LEHMAN

Attesting Officer

Commissioner of Patents and Trademarks